(12) United States Patent
Hasija et al.

(10) Patent No.: US 10,477,717 B2
(45) Date of Patent: Nov. 12, 2019

(54) SELF-ALIGNING BUSBAR ASSEMBLY

(71) Applicant: YAZAKI NORTH AMERICA, INC., Canton, MI (US)

(72) Inventors: John Joseph Hasija, Saline, MI (US); Eiji Aoki, Shizuoka (JP); Eugene Yang, Ypsilanti, MI (US)

(73) Assignee: YAZAKI NORTH AMERICA, INC., Canton, MI (US)

( * ) Notice: Subject to any disclaimer, the term of this patent is extended or adjusted under 35 U.S.C. 154(b) by 0 days.

(21) Appl. No.: 15/720,358

(22) Filed: Sep. 29, 2017

(65) Prior Publication Data

US 2019/0104634 A1  Apr. 4, 2019

(51) Int. Cl.
| | |
|---|---|
| *H05K 7/14* | (2006.01) |
| *H01R 9/24* | (2006.01) |
| *H05K 5/06* | (2006.01) |
| *H01R 105/00* | (2006.01) |
| *H01R 4/34* | (2006.01) |
| *H01R 31/06* | (2006.01) |

(52) U.S. Cl.
CPC ............ *H05K 7/1472* (2013.01); *H01R 9/24* (2013.01); *H05K 5/069* (2013.01); *H01R 4/34* (2013.01); *H01R 31/065* (2013.01); *H01R 2105/00* (2013.01); *H01R 2201/10* (2013.01); *H01R 2201/26* (2013.01); *H05K 2201/10272* (2013.01)

(58) Field of Classification Search
CPC .... H01R 13/18; H01R 13/688; H01R 13/506; H05K 7/14; H05K 7/1472; H05K 5/00–06; H05K 5/069

USPC ............... 361/760, 775–778, 782, 803, 814; 439/76.2, 607.1, 607.41, 752, 212
See application file for complete search history.

(56) References Cited

U.S. PATENT DOCUMENTS

| | | | |
|---|---|---|---|
| 6,702,612 B2 | 3/2004 | Miyazaki et al. | |
| 6,746,258 B2* | 6/2004 | Kikuchi | ............... H01R 13/635 217/1 |

(Continued)

FOREIGN PATENT DOCUMENTS

JP   2007258105 A   10/2007

OTHER PUBLICATIONS

Extended European Search Report dated Jan. 31, 2019 for EP Application No. 18196641.7, 6 pages.

*Primary Examiner* — Tuan T Dinh
(74) *Attorney, Agent, or Firm* — RMCK Law Group, PLC

(57) ABSTRACT

A self-aligning busbar assembly includes a housing, a busbar having a first terminal connecting end, a second terminal connecting end, and a jog portion disposed therebetween, and a front holder coupled to the housing and the busbar. The front holder includes an inner wall defining a busbar receiving aperture to receive at least a portion of the busbar, and at least one flexible tab extending inwardly from the inner wall into the busbar receiving aperture. The at least one flexible tab is configured to bias and center the at least a portion of the busbar within the busbar receiving aperture. At least one clearance is defined in the busbar receiving aperture between the inner wall and the busbar and is configured to enable at least one of the first and second terminal connecting ends to move to account for tolerances and/or variances during installation of the busbar assembly.

15 Claims, 6 Drawing Sheets

(56) References Cited

U.S. PATENT DOCUMENTS

| | | | |
|---|---|---|---|
| 7,909,663 B1* | 3/2011 | Bouffet | H01R 13/18 439/212 |
| 7,955,097 B2 | 6/2011 | Travis et al. | |
| 8,388,364 B2 | 3/2013 | Kikuchi | |
| 8,446,058 B2 | 5/2013 | Avula et al. | |
| 8,779,641 B2 | 7/2014 | Fujii et al. | |
| 2003/0040215 A1 | 2/2003 | Kleen | |
| 2004/0235364 A1* | 11/2004 | Matsumoto | B60L 11/1898 439/752 |
| 2006/0068617 A1 | 3/2006 | Migita et al. | |
| 2007/0105427 A1 | 5/2007 | Mori et al. | |
| 2009/0093157 A1* | 4/2009 | Aoki | H01R 13/506 439/607.01 |
| 2009/0093159 A1* | 4/2009 | Aoki | H01R 9/032 439/607.41 |
| 2011/0316372 A1 | 12/2011 | Kobayashi et al. | |
| 2012/0094537 A1* | 4/2012 | Aoki | H01R 13/688 439/620.26 |
| 2012/0094547 A1* | 4/2012 | Ando | H01R 13/504 439/736 |
| 2013/0078872 A1 | 3/2013 | Tashiro | |
| 2013/0153292 A1* | 6/2013 | Adachi | B60K 28/14 174/70 R |
| 2013/0214593 A1 | 8/2013 | Ohashi et al. | |
| 2013/0306344 A1 | 11/2013 | Toyama et al. | |
| 2014/0134869 A1* | 5/2014 | Hamai | H01R 13/111 439/345 |
| 2014/0148045 A1* | 5/2014 | Kashiwada | H01R 12/00 439/485 |
| 2016/0285335 A1* | 9/2016 | Watanabe | H02K 3/522 |

* cited by examiner

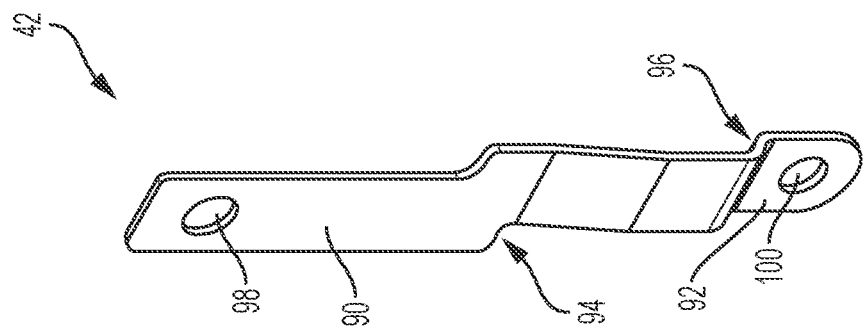
FIG. 9
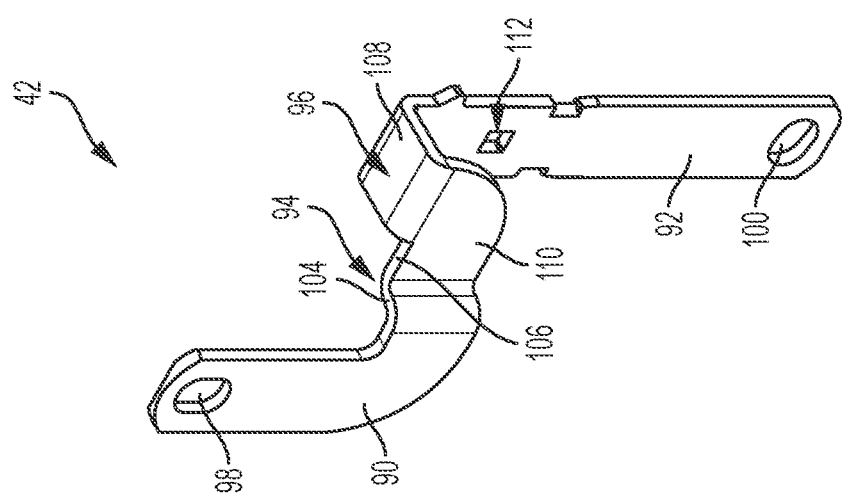
FIG. 8
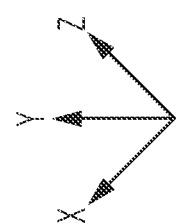

SELF-ALIGNING BUSBAR ASSEMBLY

FIELD

The present disclosure relates to electrical connections between two electrical components and, more particularly, to a movable busbar assembly that maintains sealing integrity during assembly to an electrical component.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Some hybrid vehicles may include an electrical circuit between a motor/generator and a power control unit having an inverter. A busbar may connect to electrical terminals of the motor and inverter terminals of the power control unit, thereby forming the electrical circuit between the two components. Power may be supplied from a battery to the motor by utilizing the electrical circuit, and generated power may be supplied to the battery from the generator. A current sensor may be attached to the busbar to measure the current flowing in the busbar, and feedback current control may be performed based on comparison of that measured value with a current instruction value. The motor may then be controlled at a desired revolution rate and torque with the power control unit.

However, the busbars may be a single-threaded terminal design. As such, the busbars may be rigid and not allow for the adjustment of tolerances in the electrical circuit during assembly. Moreover, multiple busbar connectors may be required, which increases packaging size and assembly time. Accordingly, while such conventional electrical circuits work for their intended purpose, it is desirable to provide an improved system that provides an adjustable interconnection during assembly.

SUMMARY

In various embodiments of the present disclosure, a self-aligning busbar assembly is disclosed. The self-aligning busbar assembly includes a housing, a busbar having a first terminal connecting end, a second terminal connecting end, and a jog portion disposed therebetween, and a front holder coupled to the housing and the busbar. The front holder includes an inner wall defining a busbar receiving aperture to receive at least a portion of the busbar, and at least one flexible tab extending inwardly from the inner wall into the busbar receiving aperture. The at least one flexible tab is configured to bias and center the at least a portion of the busbar within the busbar receiving aperture. At least one clearance is defined in the busbar receiving aperture between the inner wall and the busbar, the at least one clearance configured to enable at least one of the first and second terminal connecting ends to move to account for tolerances and/or variances during installation of the busbar assembly.

In various embodiments of the present disclosure, a vehicle is disclosed. The vehicle includes a motor having at least one motor terminal, an inverter module having at least one inverter terminal, and a self-aligning busbar assembly configured to electrically couple to the at least one motor terminal and the at least one inverter terminal. The busbar assembly includes a housing, a busbar having a first terminal connecting end, a second terminal connecting end, and a jog portion disposed therebetween, and a front holder coupled to the housing and the busbar. The front holder includes an inner wall defining a busbar receiving aperture to receive at least a portion of the busbar, and at least one flexible tab extending inwardly from the inner wall into the busbar receiving aperture. The at least one flexible tab is configured to bias and center the at least a portion of the busbar within the busbar receiving aperture. At least one clearance is defined in the busbar receiving aperture between the inner wall and the busbar, the at least one clearance configured to enable at least one of the first and second terminal connecting ends to move to account for tolerances and/or variances during installation of the busbar assembly.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 8 is a perspective view of an exemplary terminal of the busbar assembly shown in FIGS. 1-7; and FIG. 9 is a perspective view of another exemplary terminal that may be used with the busbar assembly shown in FIGS. 1-7.

DETAILED DESCRIPTION

FIGS. 1-4 illustrate an example self-aligning busbar assembly 10 configured to couple two electrical components such as a motor/generator 12 and an inverter module 14. However, the self-aligning busbar assembly 10 may be used in various other systems to connect various other electrical components.

Figure 2:
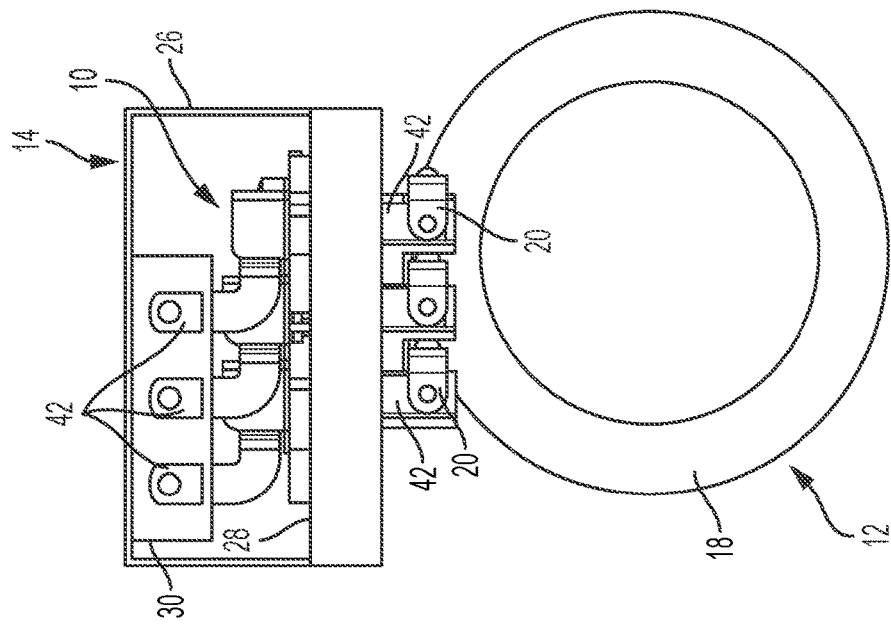
FIG. 2 is a front view of the example busbar assembly of FIG. 1.
Figure 1:
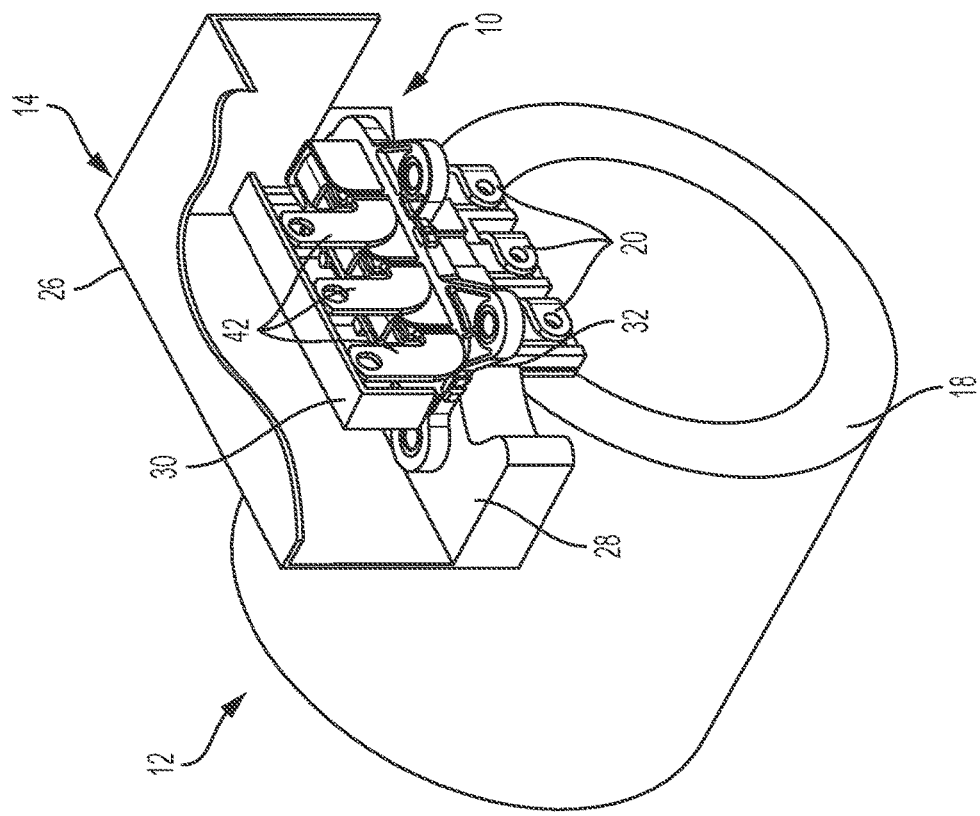
FIG. 1 is a perspective view of an example busbar assembly interconnecting two electrical components according to some implementations of the present disclosure.

In the illustrated embodiment of FIGS. 1 and 2, busbar assembly 10 electrically interconnects motor 12 and inverter module 14. Motor 12 may be configured to drive one or more wheels of a vehicle (not shown) and generally includes a stator 18, a rotor (not shown), and a plurality of motor terminals 20 electrically connected to and extending from the stator 18.

Inverter module 14 is electrically connected to the motor 12 through the busbar assembly 10 and may generally include a housing 26, a busbar assembly support wall 28, and a current sensor system 30. Housing 26 houses current sensor system 30 and at least a portion of busbar assembly 10. The busbar assembly 10 may be coupled to the busbar assembly support wall 28 and extend through one or more apertures 32 (FIG. 1) formed in the busbar assembly support wall 28. Inverter module 14 is configured to supply power from a battery (not shown) to the motor 12 via the busbar assembly 10. When motor 12 is operated as a generator, inverter module 14 is configured to supply power from the motor 12 to the battery via the busbar assembly 10.

Figure 3:
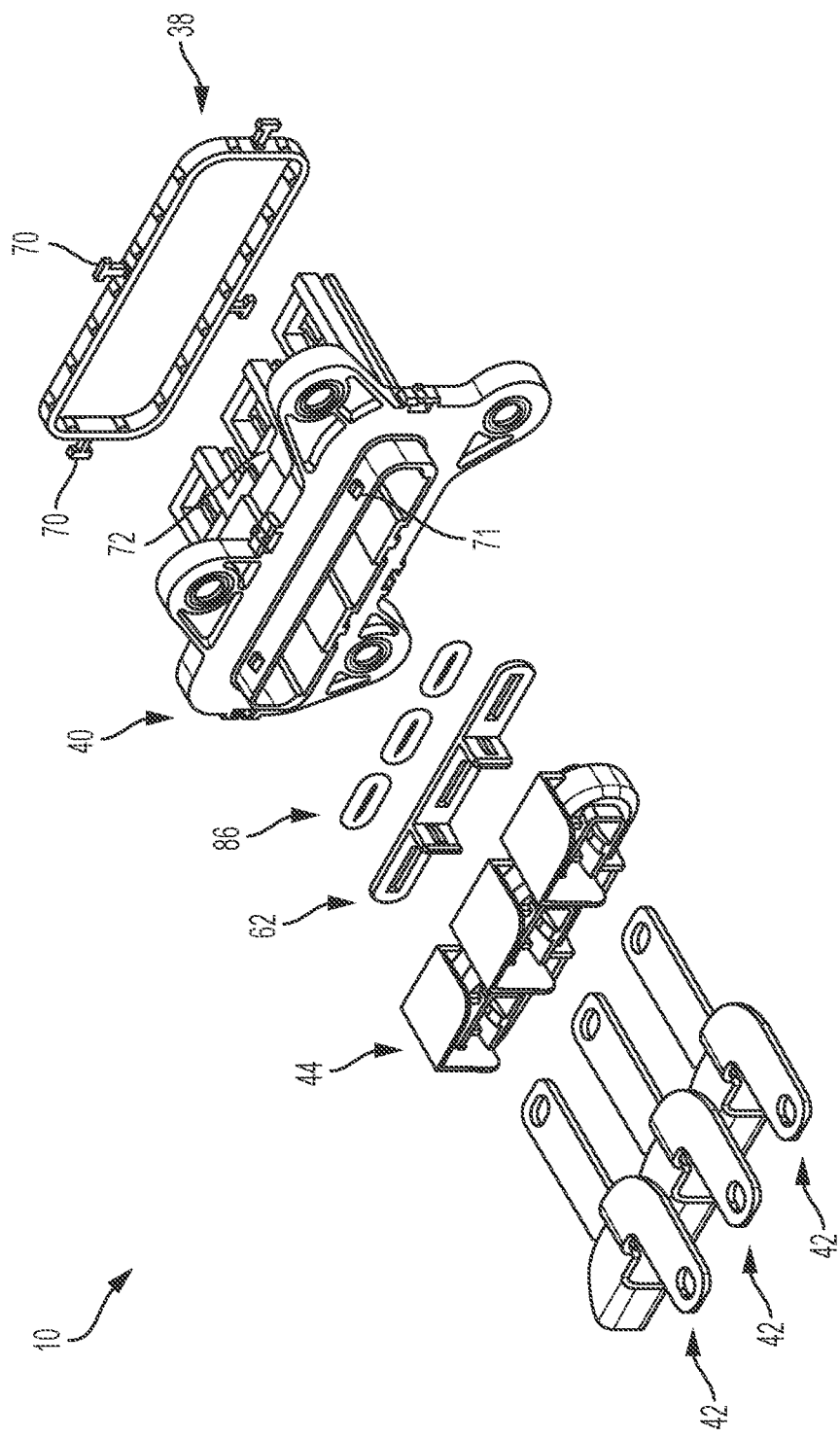
FIG. 3 is an exploded view of the busbar assembly of FIG. 1.
Figure 4:
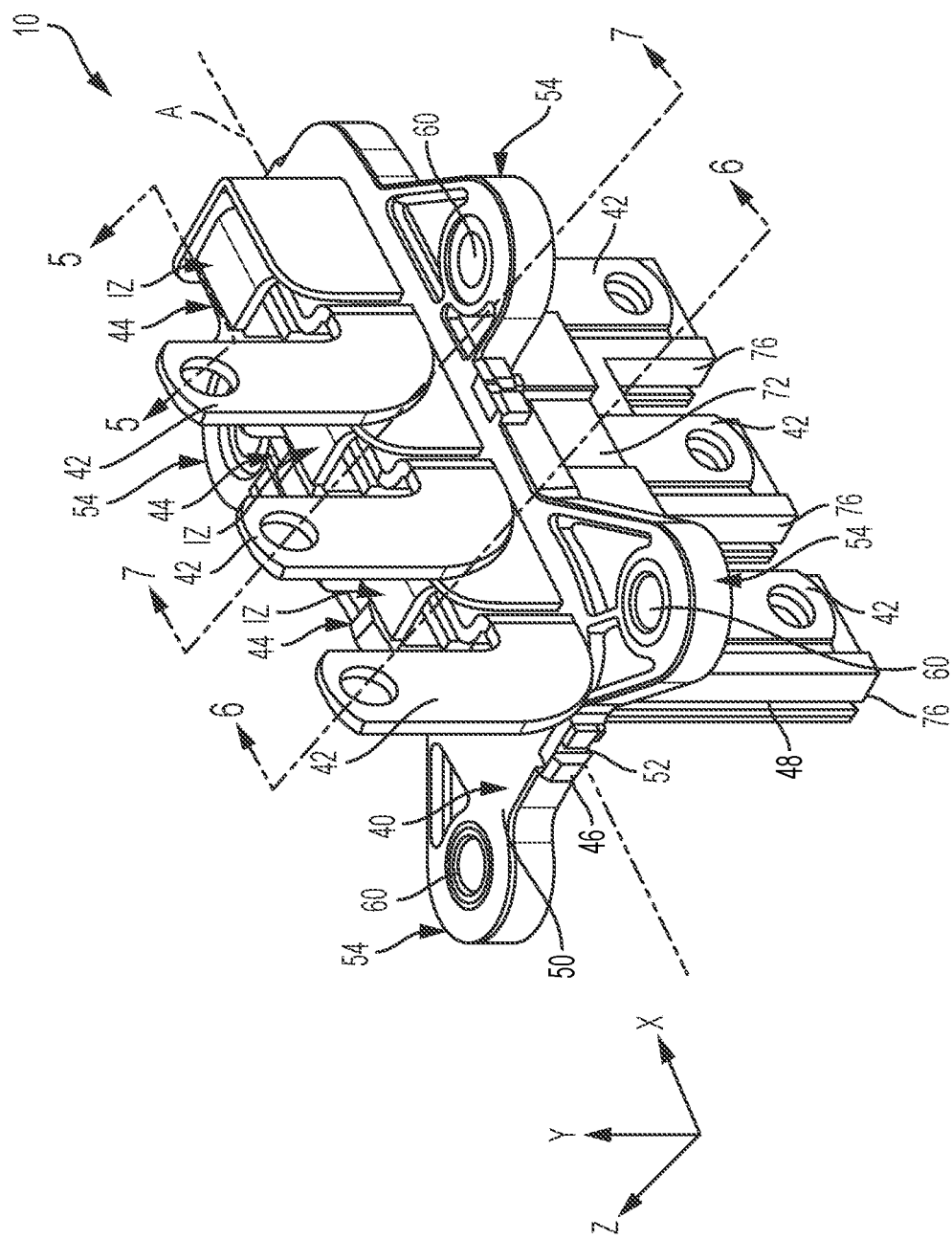
FIG. 4 is a perspective view of the busbar assembly shown in FIG. 1.

With additional reference to FIGS. 3 and 4, self-aligning busbar assembly 10 generally includes a seal member 38, a housing 40, a plurality of busbars 42, and a front holder 44. In the illustrated embodiment, housing 40 includes a base plate 46 and a busbar support 48.

Figure 5:
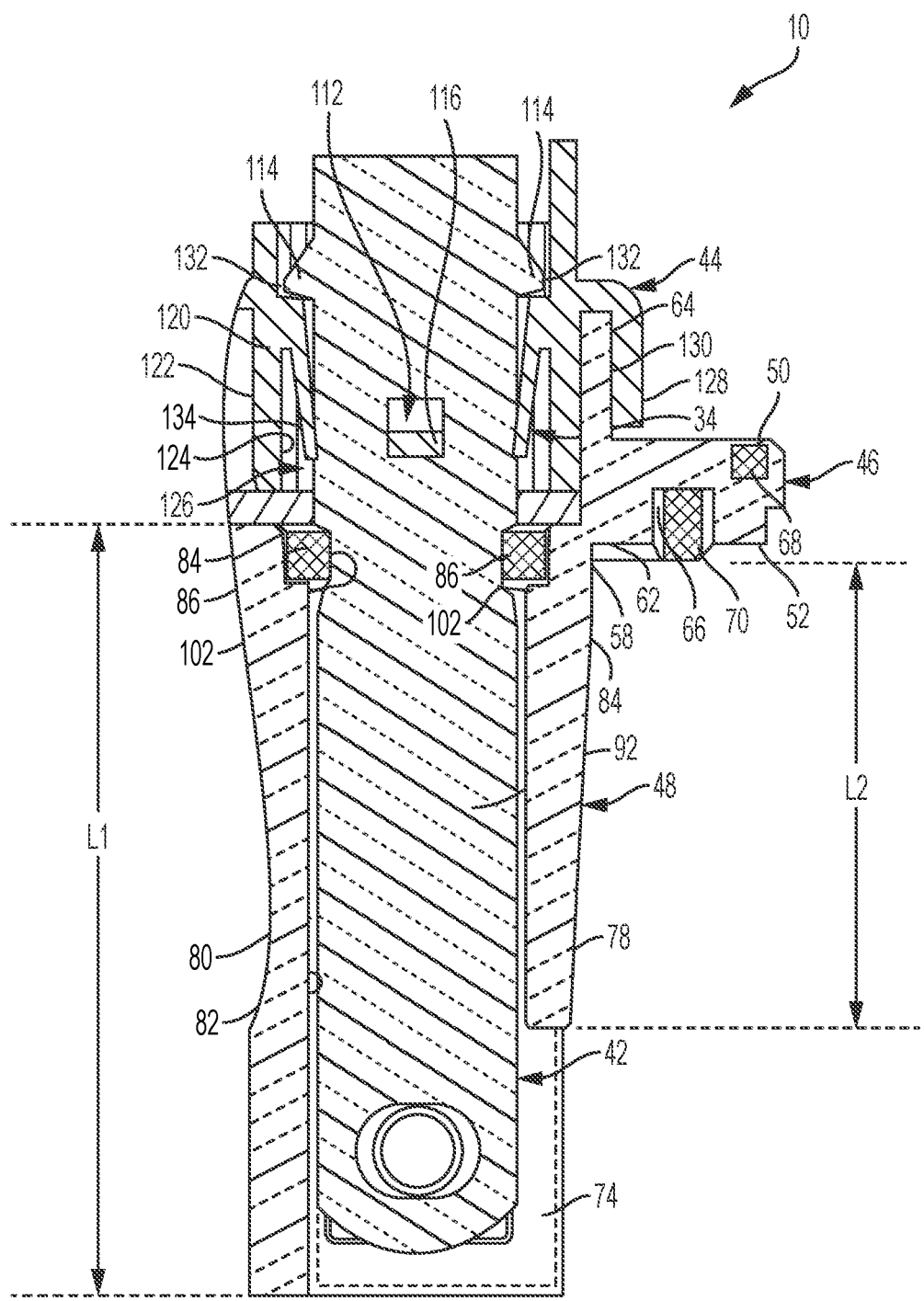
FIG. 5 is a cross-sectional view of the busbar assembly shown in FIG. 3 and taken along line 5-5.

Base plate 46 extends along a longitudinal axis 'A' and includes an upper surface 50 and a lower surface 52, which is configured to be disposed against the busbar assembly support wall 28. Base plate 46 defines a plurality of mounting members 54, a plurality of busbar apertures 56 (only one shown in FIG. 7), and an inner shoulder 58 (FIG. 5). Mounting members 54 each define a fastener aperture 60 configured to receive one or more fastener (e.g., a bolt) to couple base plate 46 to support wall 28. Busbar apertures 56 are each configured to receive one of the busbars 42 therethrough such that a portion of busbar 42 extends into busbar support 48. Inner shoulder 58 defines a surface to receive a spacer 62 (FIGS. 3 and 5) configured to separate housing 40 and front holder 44.

Figure 6:
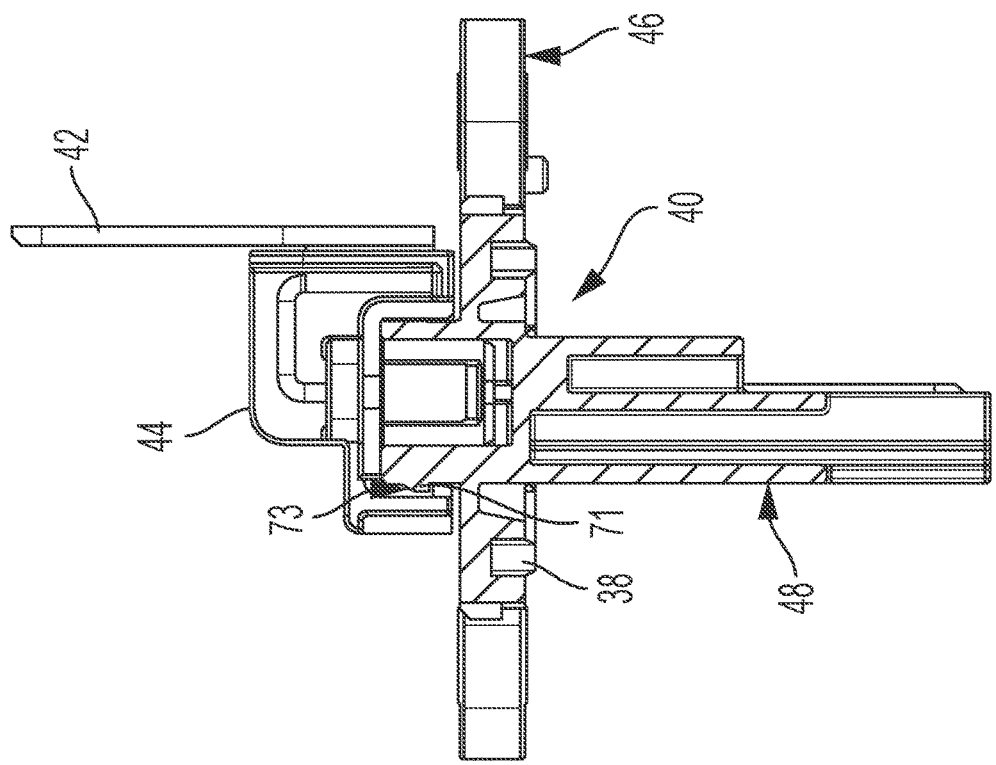
FIG. 6 is a cross-sectional view of the busbar assembly shown in FIG. 3 and taken along line 6-6.

As shown in FIGS. 3-7, base plate 46 further defines a connecting flange 64, a seal ring recess 66, and a recess 68. Connecting flange 64 is configured to be received within front holder 44, seal ring recess 66 is configured to receive seal ring 38, and recess 68 is configured to receive a hanger 70 of seal ring 38 (see FIG. 3). As shown in FIGS. 3, 5 and 6, connecting flange 64 (FIG. 5) includes retention tabs or features 71 each configured to be received within a front holder aperture 73 (FIG. 6) to thereby couple front holder 44 to base plate 46.

Busbar support 48 is coupled to and extends from base plate lower surface 52 in a direction perpendicular to or substantially perpendicular to axis 'A'. With continued reference to FIG. 5, busbar support 48 generally includes a front wall 72 (FIG. 3), a rear wall 74, and opposed sidewalls 76 and 78. Rear wall 74 and sidewall 76 have a length L1 configured to at least partially enclose and support busbar 42, and sidewall 78 has a length L2 that is shorter than length L1 to accommodate motor terminals 20, as shown in FIGS. 1 and 2. Walls 72, 74, 76, 78 collectively define a busbar receiving channel 80 having an inner wall 82. A busbar seal recess 84 is formed in inner wall 82 and is configured to receive a busbar seal 86 configured to establish a seal between busbar 42 and the housing 40.

As shown in FIGS. 1-4, busbar assembly 10 includes three busbars 42 arranged in parallel to form a three-phase electrical circuit. However, busbar assembly 10 may have any suitable number of busbars 42 that enables assembly 10 to function as defined herein. With additional reference to FIG. 8, each busbar 42 includes a first terminal connecting end 90, a second terminal connecting end 92, a first jog portion 94, and a second jog portion 96. However, busbar 42 may have alternative configurations of first and second jog portions, for example as shown in FIG. 9.

First end 90 includes a fastener insertion aperture 98 and is configured to be coupled to an electrical terminal such as an inverter terminal (not shown) of the inverter module 14. As such, a fastener (not shown) may be inserted through aperture 98 and the inverter terminal for coupling therebetween. Second end 92 includes a fastener insertion aperture 100 and is configured to be coupled to an electrical terminal such as motor terminals 20. As such, a fastener (not shown) may be inserted through aperture 100 and the motor terminal 20 for coupling therebetween. However, alternate methods of coupling between busbars 42 and the terminals or other connections is envisioned. Further, second end 92 includes opposed recesses or notches 102 (FIG. 5) formed therein to receive and support at least a portion of the busbar seal 86.

In the example embodiment of FIG. 8, first jog portion 94 is coupled to busbar first end 90 and includes a first portion 104 and a second portion 106. First portion 104 is coupled between second portion 106 and first end 90 and extends orthogonal to or substantially orthogonal to both first end 90 and second portion 106. Accordingly, the orientation of first jog portion 94 is configured to allow busbar first end 90 and/or second end 92 to move or flex in the +/− x-direction (see FIGS. 4 and 8). As such, this allows for flexure or movement of the busbar ends 90 and/or 92 during installation of busbar assembly 10 to account for assembly tolerances/variances between the two components (e.g., between busbar assembly 10 and at least one of motor 12 and inverter module 14).

In the example embodiment, second jog portion 96 is coupled between the first jog portion 94 and the busbar second end 92. The second jog portion 96 includes a first portion 108 and a second portion 110. First portion 108 is coupled between second portion 110 and second end 92 and extends orthogonal to or substantially orthogonal to both second end 92 and second portion 110. Accordingly, the orientation of second job portion 96 is configured to allow busbar first end 90 and/or second end 92 to move or flex in the +/− z-direction (see FIGS. 4 and 8). As such, this allows for flexure or movement of the busbar ends 90 and/or 92 during installation of busbar assembly 10 to account for assembly tolerances/variances between the two components (e.g., between busbar assembly 10 and at least one of motor 12 and inverter module 14).

Figure 7:
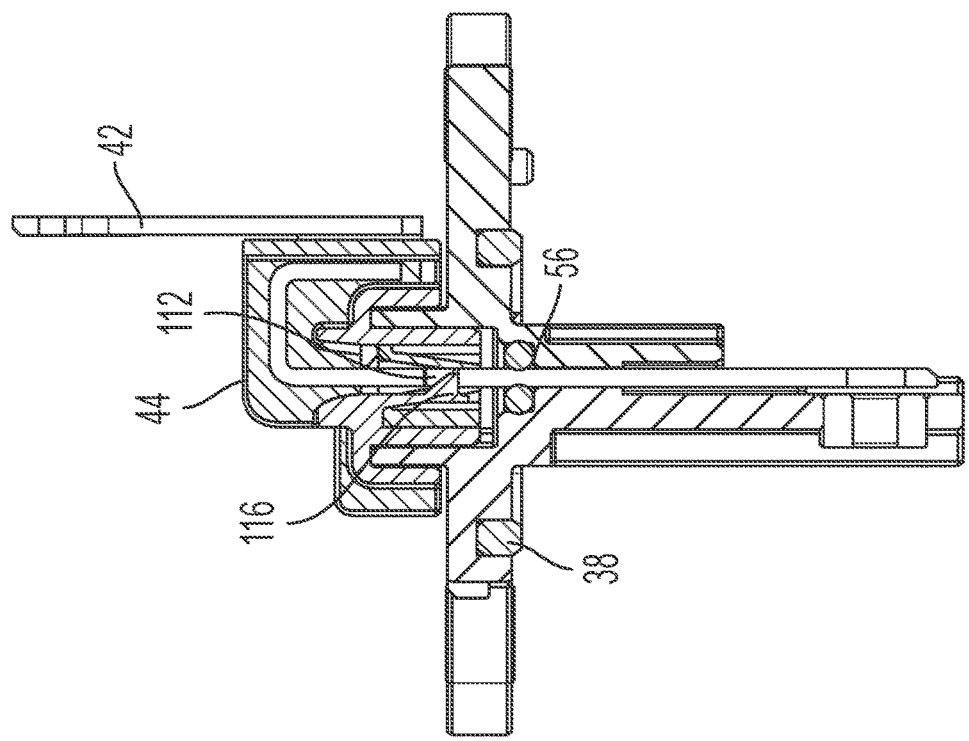
FIG. 7 is a cross-sectional view of the busbar assembly shown in FIG. 3 and taken along line 7-7.

With continued reference to FIGS. 5, 7, and 8, busbar second end 92 may further include a receiving aperture 112 and one or more angular retaining features 114. Receiving aperture 112 is configured to receive an arm or clip 116 of the front holder 44 to facilitate coupling of the front holder 44 to busbar 42. Angular retaining features 114 are configured to engage front holder 44 for securing the front holder 44 to busbar 42.

In the example embodiment, front holder 44 is configured to couple to housing 40 and busbar 42 to establish an anchor point or secured intermediate zone 'IZ' (e.g., comprising jog portions 94, 96) from which busbar ends 90 and/or 92 may move or flex. As shown in FIG. 5, front holder 44 generally includes a main body portion 120 having an outer wall 122, and an inner wall 124 defining a busbar receiving aperture 126. A holder flange 128 extends from outer wall 122 and defines a receiving channel 130 therebetween. The receiving channel 130 is configured to receive the base plate connecting flange 64 to facilitate coupling front holder 44 to housing 40.

Front holder 44 includes a receiving shoulder 132 and one or more flexible fingers or tabs 134. Shoulder 132 extends inwardly from inner wall 124 and is configured to seat against busbar angular retaining feature 114 and prevent movement of busbar 42 in the − y-direction. Clip 116 is configured to prevent movement in the + y-direction. Flexible tabs 134 extend from inner wall 124 into busbar receiving aperture 126 and are configured to bias busbar 42 centrally within busbar receiving aperture 126. Accordingly, flexible tabs 134 center busbar 42 for initial assembly, but are flexible to allow the movement or flexure of busbar 42 in the x-direction, as described herein.

A method of assembling busbar assembly 10 includes providing seal ring 38, housing 40, busbar 42, front holder 44, spacer 62, and busbar seal 86. Housing 40, front holder 44, and/or spacer 62 may be formed by injection molding or other suitable process. Busbar seal 86 may be disposed in busbar seal recess 84 by spacer 62, which may provide a solid, flat surface to push busbar seal 86 into the recess 84. Busbar 42 may be subsequently inserted through housing base plate 46 into busbar support 48. Alternatively, busbar seal 86 may be seated to busbar notches 102, and busbar 42 is subsequently inserted through housing base plate 46 into busbar support 48. Front holder 44 may then be inserted over the second jog portion 96 such that flexible tab 134 engages and centers busbar 42 within aperture 126, angular retention features are seated against receiving shoulder 132, clip 116 extends into receiving aperture 112, and connecting flange 64 is disposed within receiving channel 130. Seal ring 38 may then be seated within recess 66 of housing 40.

Described herein are systems and methods for a movable, self-aligning busbar assembly. The busbar assembly includes a housing, a busbar, a spacer, and a front holder coupled to the housing and busbar. The front holder includes a busbar receiving aperture and calculated clearances are defined therein between the busbar and the front holder, the spacer, and the housing. The clearances enable the busbar to move or flex in one or more predetermined directions of an orthogonal coordinate system to account for tolerances or variances between the assembled components. The front holder includes inwardly extending flexible tabs to biasingly center the busbar for installation, but enable movement in the one or more predetermined directions during installation. A seal disposed between the busbar and the housing enables the movement of the busbar while maintaining sealing integrity during the installation of the busbar assembly. As such, the busbar assembly permits busbars to move and retain sealing integrity during assembly between two components such as an inverter module and a motor.

Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known procedures, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The term "and/or" includes any and all combinations of one or more of the associated listed items. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A self-aligning busbar assembly comprising:
    a housing;
    a busbar having a first terminal connecting end extending in a first direction, a second terminal connecting end extending in a second direction opposite the first direction, and a jog portion disposed therebetween, the jog portion comprising a first jog portion and a second jog portion; and
    a front holder coupled to the housing and the busbar, the front holder including an inner wall defining a busbar receiving aperture to receive at least a portion of the busbar, and at least one flexible tab extending inwardly from the inner wall into the busbar receiving aperture, the at least one flexible tab configured to bias and center the at least a portion of the busbar within the busbar receiving aperture,
    wherein at least one clearance is defined in the busbar receiving aperture between the inner wall and the busbar, the at least one clearance configured to enable at least one of the first and second terminal connecting ends to move to account for tolerances and/or variances during installation of the busbar assembly,
    wherein the first jog portion extends substantially perpendicular to both the second jog portion and the first and second terminal connecting ends, and
    wherein the second jog portion extends substantially perpendicular to both the first jog portion and the first and second terminal connecting ends.

2. The assembly of claim 1, further comprising a busbar seal disposed between the housing and the busbar, wherein the housing includes a busbar receiving channel having a busbar seal recess formed therein, the busbar seal recess configured to at least partially support the busbar seal.

3. The assembly of claim 1, wherein the housing includes a base plate and a connecting flange extending outwardly therefrom, and the front holder further includes a main body portion and a holder flange extending outwardly therefrom to define a receiving channel between the main body portion and the holder flange, wherein the connecting flange is disposed in the receiving channel.

4. A vehicle comprising:
a motor having at least one motor terminal;
an inverter module having at least one inverter terminal; and
the self-aligning busbar assembly of claim 1, wherein the self-aligning busbar assembly is configured to electrically couple to the at least one motor terminal and the at least one inverter terminal.

5. The assembly of claim 2, further comprising a pair of notches formed in the busbar, the pair of notches configured to at least partially support the busbar seal.

6. The vehicle of claim 4, wherein the first terminal connecting end is coupled to the at least one inverter terminal, and the second terminal connecting end is coupled to the at least one motor terminal.

7. The vehicle of claim 4, further comprising a spacer disposed about the busbar between the housing and the front holder.

8. A self-aligning busbar assembly comprising:
a housing;
a busbar having a first terminal connecting end extending in a first direction, a second terminal connecting end extending in a second direction opposite the first direction, and a jog portion disposed therebetween; and
a front holder coupled to the housing and the busbar, the front holder including an inner wall defining a busbar receiving aperture to receive at least a portion of the busbar, and at least one flexible tab extending inwardly from the inner wall into the busbar receiving aperture, the at least one flexible tab configured to bias and center the at least a portion of the busbar within the busbar receiving aperture,
wherein at least one clearance is defined in the busbar receiving aperture between the inner wall and the busbar, the at least one clearance configured to enable at least one of the first and second terminal connecting ends to move to account for tolerances and/or variances during installation of the busbar assembly,
wherein the first jog portion includes a first portion and a second portion, the first portion extending substantially perpendicular to both the second portion and the first and second terminal connecting ends, and
wherein the second jog portion includes a third portion and a fourth portion, the third portion extending substantially perpendicular to both the fourth portion and the first and second terminal connecting ends.

9. The assembly of claim 8, wherein the first portion is substantially perpendicular to the third portion, and the first connecting terminal end, the second connecting terminal end, the second portion, and the fourth portion are substantially parallel.

10. The assembly of claim 8, further comprising a busbar seal disposed between the housing and the busbar, wherein the housing includes a busbar receiving channel having a busbar seal recess formed therein, the busbar seal recess configured to at least partially support the busbar seal.

11. The assembly of claim 10, further comprising a pair of notches formed in the busbar, the pair of notches configured to at least partially support the busbar seal.

12. A self-aligning busbar assembly comprising:
a housing;
a busbar having a first terminal connecting end extending in a first direction, a second terminal connecting end extending in a second direction opposite the first direction, and a jog portion disposed therebetween, the jog portion comprising a first jog portion and a second jog portion; and
a front holder coupled to the housing and the busbar, the front holder including an inner wall defining a busbar receiving aperture to receive at least a portion of the busbar, and at least one flexible tab extending inwardly from the inner wall into the busbar receiving aperture, the at least one flexible tab configured to bias and center the at least a portion of the busbar within the busbar receiving aperture,
wherein at least one clearance is defined in the busbar receiving aperture between the inner wall and the busbar, the at least one clearance configured to enable at least one of the first and second terminal connecting ends to move to account for tolerances and/or variances during installation of the busbar assembly,
wherein the front holder further includes:
a busbar receiving aperture with a receiving shoulder formed therein, and the busbar further includes at least one angular retention feature configured to seat with and engage the receiving shoulder to prevent removal of the front holder from the busbar; and
a front holder aperture configured to receive a retention tab of the housing to thereby secure the front holder to the housing,
wherein the first jog portion extends substantially perpendicular to both the second jog portion and the first and second terminal connecting ends, and
wherein the second jog portion extends substantially perpendicular to both the first jog portion and the first and second terminal connecting ends.

13. The assembly of claim 12, further comprising a busbar seal disposed between the housing and the busbar, wherein the housing includes a busbar receiving channel having a busbar seal recess formed therein, the busbar seal recess configured to at least partially support the busbar seal.

14. The assembly of claim 12, wherein the housing includes a base plate and a connecting flange extending outwardly therefrom, and the front holder further includes a main body portion and a holder flange extending outwardly therefrom to define a receiving channel between the main body portion and the holder flange, wherein the connecting flange is disposed in the receiving channel.

15. The assembly of claim 13, further comprising a pair of notches formed in the busbar, the pair of notches configured to at least partially support the busbar seal.

* * * * *